(12) United States Patent
Lee et al.

(10) Patent No.: US 7,649,208 B2
(45) Date of Patent: Jan. 19, 2010

(54) LIGHT EMITTING DIODE PACKAGE INCLUDING MONITORING PHOTODIODE

(75) Inventors: Sung Jun Lee, Seoul (KR); Woong Lin Hwang, Kyungki-do (KR); Seog Moon Choi, Seoul (KR); Ho Joon Park, Seoul (KR); Sang Hyun Choi, Seoul (KR); Chang Hyun Lim, Seoul (KR)

(73) Assignee: Samsung Electro-Mechanics Co., Ltd., Suwon, Hyungki-Do (KR)

( * ) Notice: Subject to any disclaimer, the term of this patent is extended or adjusted under 35 U.S.C. 154(b) by 292 days.

(21) Appl. No.: 11/313,508

(22) Filed: Dec. 21, 2005

(65) Prior Publication Data

US 2006/0192084 A1     Aug. 31, 2006

(30) Foreign Application Priority Data

Feb. 25, 2005   (KR)  ...................... 10-2005-0016151

(51) Int. Cl.
*H01L 27/15*   (2006.01)
(52) U.S. Cl. .............................. 257/82; 257/84; 257/98; 257/444; 257/E33.001
(58) Field of Classification Search .................. 257/82, 257/84, 98, 444
See application file for complete search history.

(56) References Cited

U.S. PATENT DOCUMENTS

| 5,629,534 A | * | 5/1997 | Inuzuka et al. ................. 257/84 |
| 7,212,556 B1 | | 5/2007 | Kume et al. |
| 2004/0101006 A1 | | 5/2004 | Iwafuji |

FOREIGN PATENT DOCUMENTS

| JP | 58200583 A | | 11/1983 |
| JP | 03222384 A | | 10/1991 |
| JP | 04-023360 | * | 1/1992 |
| JP | 09199795 A | | 7/1997 |
| JP | 2001068784 A | | 3/2001 |
| JP | 2004179273 A | | 6/2004 |

* cited by examiner

*Primary Examiner*—Wai-Sing Louie
(74) *Attorney, Agent, or Firm*—Volpe and Koenig, P.C.

(57) ABSTRACT

The present invention relates to an LED package including photo diode. The LED package includes a silicon substrate, and a photo diode is formed in an upper part thereof. Also, an insulation layer is formed on the silicon substrate excluding at least a light-receiving area of the photodiode. In the LED package, an LED terminal is formed on the insulation layer to be connected to the photo diode. First and second LED connecting pads are formed on the insulation layer, and arranged on both sides of the photo diode. In addition, an LED chip is mounted on the silicon substrate, and connected to the first and second LED connecting pads.

10 Claims, 4 Drawing Sheets

(a)

(b)

LIGHT EMITTING DIODE PACKAGE INCLUDING MONITORING PHOTODIODE

CLAIM OF PRIORITY

This application claims the benefit of Korean Patent Application No. 2005-16151 filed on Feb. 25, 2005, in the Korean Intellectual Property Office, the disclosure of which is incorporated herein by reference.

BACKGROUND OF THE INVENTION

1. Field of the Invention

The present invention relates to a Light Emitting Diode (LED) package. More particularly, the present invention relates to the LED package including photo diode which detects actual quantity of output light to stabilize light output.

2. Description of the Related Art

Recently a Light Emitting Diode (LED) has been used as a next-generation lighting source due to its higher-power and higher efficiency compared with other light sources. In general, unlike light source for a simple indicator, lighting source is required to maintain stability of light output. However, the LED has disadvantages in that temperature change resulting from its own heat generation alters light output and peak wavelength.

Therefore, there is a need for a package combining the LED used as light source with a photo diode capable of maintaining light output and peak wavelength uniformly by conducting real time feedback control of the LED.

Conventionally, photo diodes have been simply mounted on a lead frame on which LEDs are provided, in positions adjacent to the LEDs. U.S. Pat. No. 4,794,431 discloses a side-by-side arrangement in which a pair of photo diodes are arranged on two sides adjacent to the LED, as shown in FIG. 1.

According to the reference cited, by arranging the pair of photo diodes on two adjacent sides of the LED on the lead frame, respectively, the photo diodes can be arranged more adjacent geometrically, to absorb side light of the LED effectively, and thus the light output of the LED can be precisely monitored.

But such an arrangement according to the reference cited inevitably causes physical separation since an LED package and a photo diode package are arranged separately on the lead frame. This renders it unlikely that optical connection efficiency is heightened. In addition, since a great deal of noise may interfere with the detected light due to change in other external environments, it is hard to expect high reliability.

SUMMARY OF THE INVENTION

The present invention has been made to solve the foregoing problems of the prior art and it is therefore an object of the present invention to provide a Light Emitting Diode (LED) package including photo diode by replacing a submount substrate with a silicon substrate for LED packaging and forming a photo diode in the silicon substrate to enhance reliability with respect to optical connection efficiency and optical output detection.

According to an aspect of the invention for realizing the object, there is provided a light emitting diode (LED) package comprising:

a silicon substrate;

a photo diode formed in an upper part of the silicon substrate;

an insulation layer formed on the silicon substrate excluding at least a light-receiving area of the photo diode;

a photo diode connecting terminal formed on the insulation layer to be connected to the photo diode;

first and second LED connecting pads formed on the insulation layer, and arranged on both sides of the photo diode; and an LED chip mounted on the silicon substrate, and connected to the first and second LED connecting pads.

Preferably, to improve optical connection efficiency for photo diode, the LED chip has a light-emitting area placed corresponding to the light-receiving area of the photo diode. The photo diode can be formed via an impurity diffusion process or an epitaxial layer growth process.

Furthermore, the LED package according to the invention may be applied to the LED having various structures.

In the first embodiment of the invention, the LED chip has a planar electrode structure with first and second electrodes facing one direction, and the first and second electrodes are flip-chip bonded to the first and second connecting pads.

In the second embodiment of the invention, the LED chip has first and second electrodes facing one direction, and the first and second electrodes are wire bonded to the first and second connecting pads, respectively.

In the third embodiment of the invention, the second connecting pad is extended to an area where the LED chip is mounted on the insulation layer, wherein the LED chip has a vertical electrode structure with first and second electrodes formed on opposed faces, respectively, the first electrode being wire-bonded to the first connecting pad, and the second electrode being connected to the extended area of the second connecting pad.

Also, the light-receiving area of the photo diode may comprise a partially reflective film having a low light transmittance in accordance with desired light quantity. According to the invention, the photo diode is configured as a single package in the LED, and thus by receiving light partially through the partially reflective film, better optical connection efficiency is attainable compared with a conventional method.

The partially reflective film may have a reflectivity of 70% to 90% to prevent decrease in light extraction efficiency of the LED. The partially reflective film may be made of a material selected from a group consisting of $SiO_2$, $TiO_2$, $Si_3N_4$, $ZrO_2$ and $HfO_2$, and a proper thickness of the film ensures desired optical properties. The partially reflective film may be made of an insulating material. If the film is made of the insulating material, the partially reflective film may be integrally formed with the insulation layer to serve as an insulation layer portion having a partially reflective function.

The photo diode employed in this invention is configurable as various structures that can be formed in the silicon substrate, and the connecting terminal of the photo diode can be varied adequately according to each structure.

For example, the photo diode may include the first and second conductivity-type impurity areas formed in the upper part of the silicon substrate and the photo diode connecting terminal may comprise first and second terminals connected to each of the impurity areas.

The silicon substrate is a first conductivity-type substrate having an electrode formed in a lower part thereof, the photo diode is formed by doping second conductivity-type impurity in an area of the upper part of the first conductivity-type silicon substrate, and the photodiode connecting terminal is formed on the insulation layer to be connected to the second conductivity-type impurity area.

BRIEF DESCRIPTION OF THE DRAWINGS

The above and other objects, features and other advantages of the present invention will be more clearly understood from the following detailed description taken in conjunction with the accompanying drawings, in which:

FIG. 2a is a view illustrating a Light Emitting Diode (LED) package according to the first embodiment of the invention;

FIG. 2b is a top view illustrating a surface of a submount substrate of the package shown in FIG. 2a;

FIG. 3a is a sectional view of the LED package according to the second embodiment of the invention;

FIG. 3b is an upper top view illustrating a surface of a submount substrate of the package shown in FIG. 3a;

FIG. 4a is a sectional view of the LED package according to the third embodiment of the invention; and FIG. 4b is an upper top view illustrating a surface of a submount substrate of the package shown in FIG. 4a.

DETAILED DESCRIPTION OF THE PREFERRED EMBODIMENT

Preferred embodiments of the present invention will now be described in detail with reference to the accompanying drawings.

Figure 1:
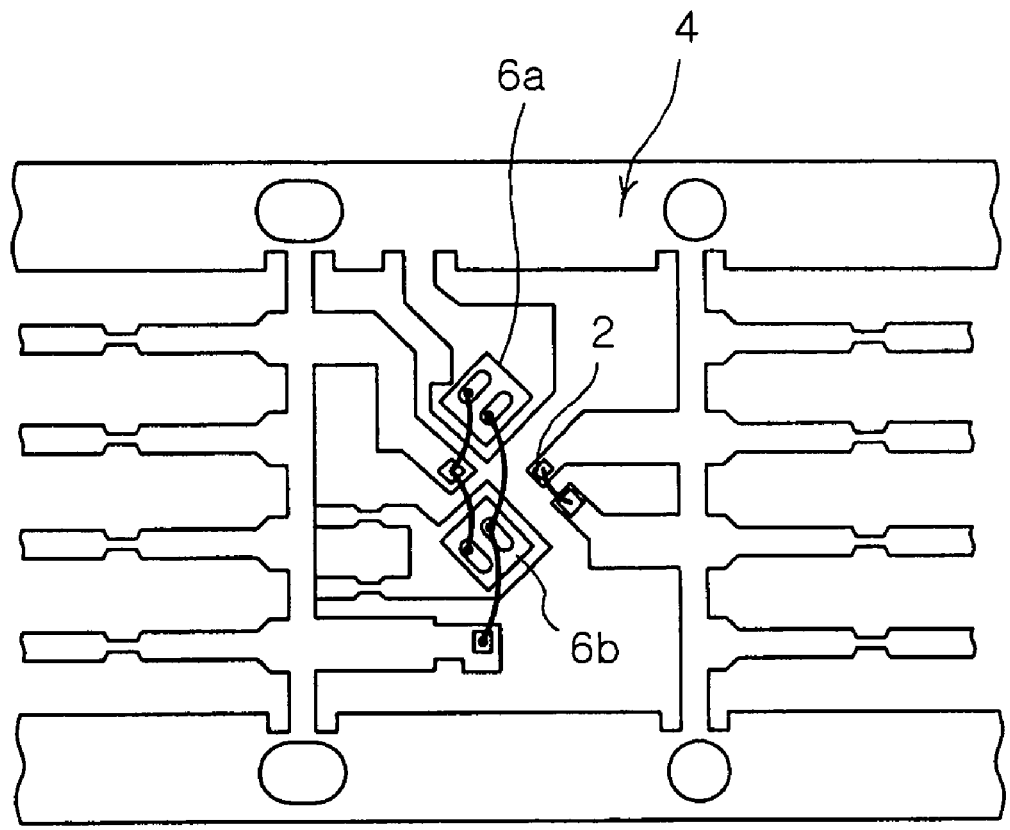
FIG. 1 is a sectional view illustrating a conventional Light Emitting Diode (LED) package including monitoring photo diode.
Figure 2:
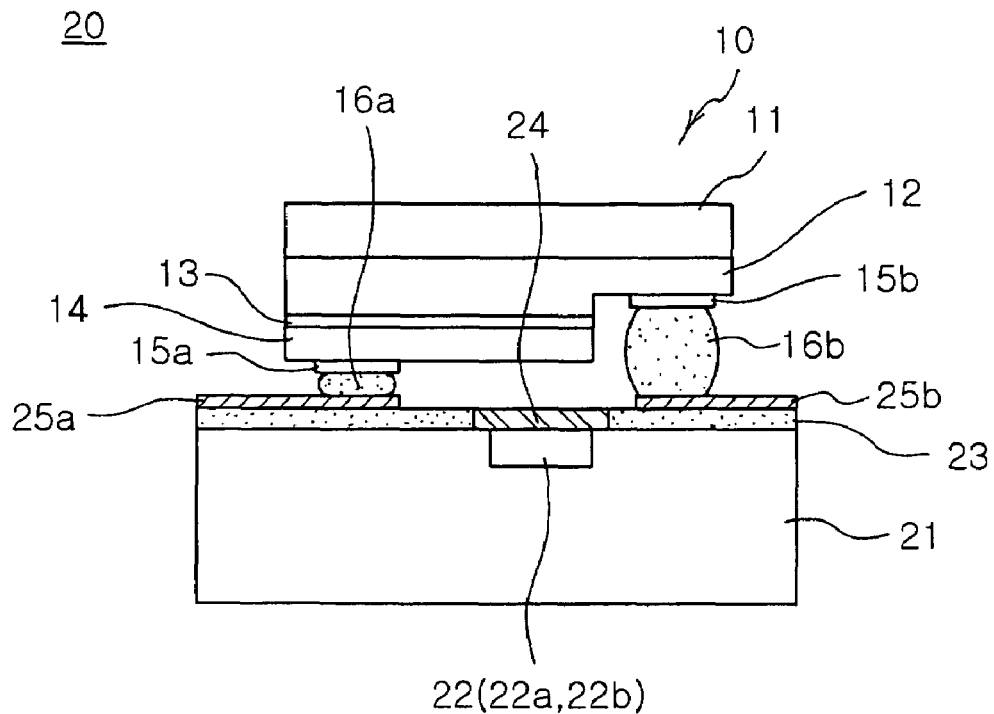
Figure 2:
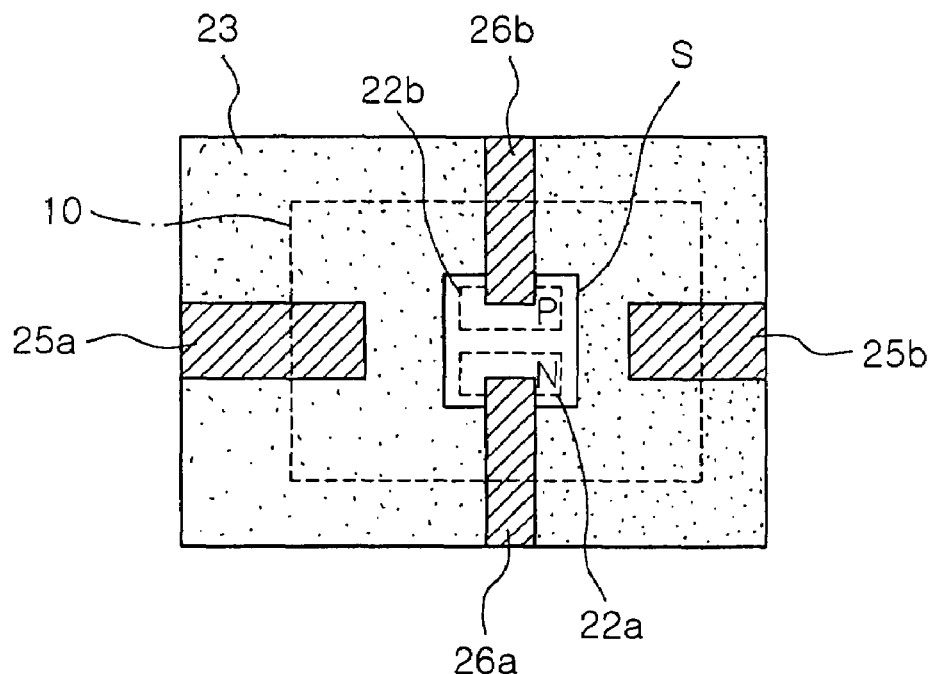

FIG. 2a is a sectional view of a Light Emitting Diode (LED) package according to the first embodiment of the invention.

The LED package 20 shown in FIG. 2a includes a silicon substrate 21 having a photo diode 22 provided in an upper part, and an LED chip 10 mounted on the silicon substrate 21. The photo diode 22 may be a PIN structure including p- and n-type impurity areas 22a, 22b formed via a diffusion process in an area of the upper part of the silicon substrate 21. The embodiment of the invention depicts forming the photo diode via a diffusion process, which however can be formed via a typical epitaxial layer growth process, as is easily understood by those skilled in the art.

The LED chip 10 includes a first conductivity-type semiconductor layer 12, an active layer 13 and a second conductivity-type semiconductor layer 14, which are sequentially formed on a substrate 11. According to the embodiment of the invention, the LED chip 10 has a planar structure in which first and second electrodes 15a, 15b face one direction.

An insulation layer 23 is formed on the silicon substrate 21 excluding at least a light-receiving area of the photo diode 22. The light-receiving area of the photo diode may include a partially reflective film 24. The partially reflective film 24 is made of a material having low light transmittance so that light generated by the very adjacent LED chip 10 can be transmitted to the photo diode 22 at a proper intensity.

The partially reflective film 24 is preferably formed of a material having optical efficiency of 70 to 90% considering optical efficiency of the LED chip 10. The partially reflective film 24 may be made of a material selected from a group consisting of $SiO_2$, $TiO_2$, $Si_3N_4$, $ZrO_2$ and $HfO_2$. Also, the partially reflective film 24 may be advantageously formed with the insulation layer 23 integrally in case where it is formed of a suitable insulating material.

The insulation layer 23 provides an area in which first and second connecting terminals 26a, 26b of FIG. 2b are formed for the photo diode 22, and first and second connecting pads 25a, 25b are formed for the LED chip 10. The first and second connecting pads 25a, 25b are arranged on both sides of the photo diode 22, respectively, and the LED chip 10 may be flip-chip bonded thereto, respectively. That is, first and second electrodes 15a, 15b of the LED chip 10 are soldered 16a, 16b to the first and second connecting pads 25a, 25b respectively. The first and second connecting pads 25a, 25b are arranged on both sides of the photo diode 22 so that a light-emitting area of the LED chip 10 and a light-receiving area of the photo diode 22 adjoin each other.

FIG. 2b shows an arrangement of the connecting terminals 26a, 26b for the photo diode 22 and of the connecting pads 25a, 25b for the LED chip 10 according to the embodiment of the invention.

Referring to FIG. 2b, the insulation layer 23 is formed on the silicon substrate 21 to expose a photo diode formation area S. The first and second connecting pads 25a, 25b are formed outside the photo diode formation area S, on both sides opposing each other. The first and second terminals 26a, 26b are connected to each of the impurity areas 22a, 22b and extended outside the LED chip 10. Likewise, to allow the silicon substrate 21 having the photo diode 22 to be used as a submount substrate, the silicon substrate 21 may have connection patterns suitable for the photo diode 22 and the flip chip LED 10.

The invention is configurable in another package form having connection patterns other than flip-chip bonding. Further, a specified conductivity-type silicon substrate can be used as a submount substrate to be configured as the photo diode.

Figure 3:
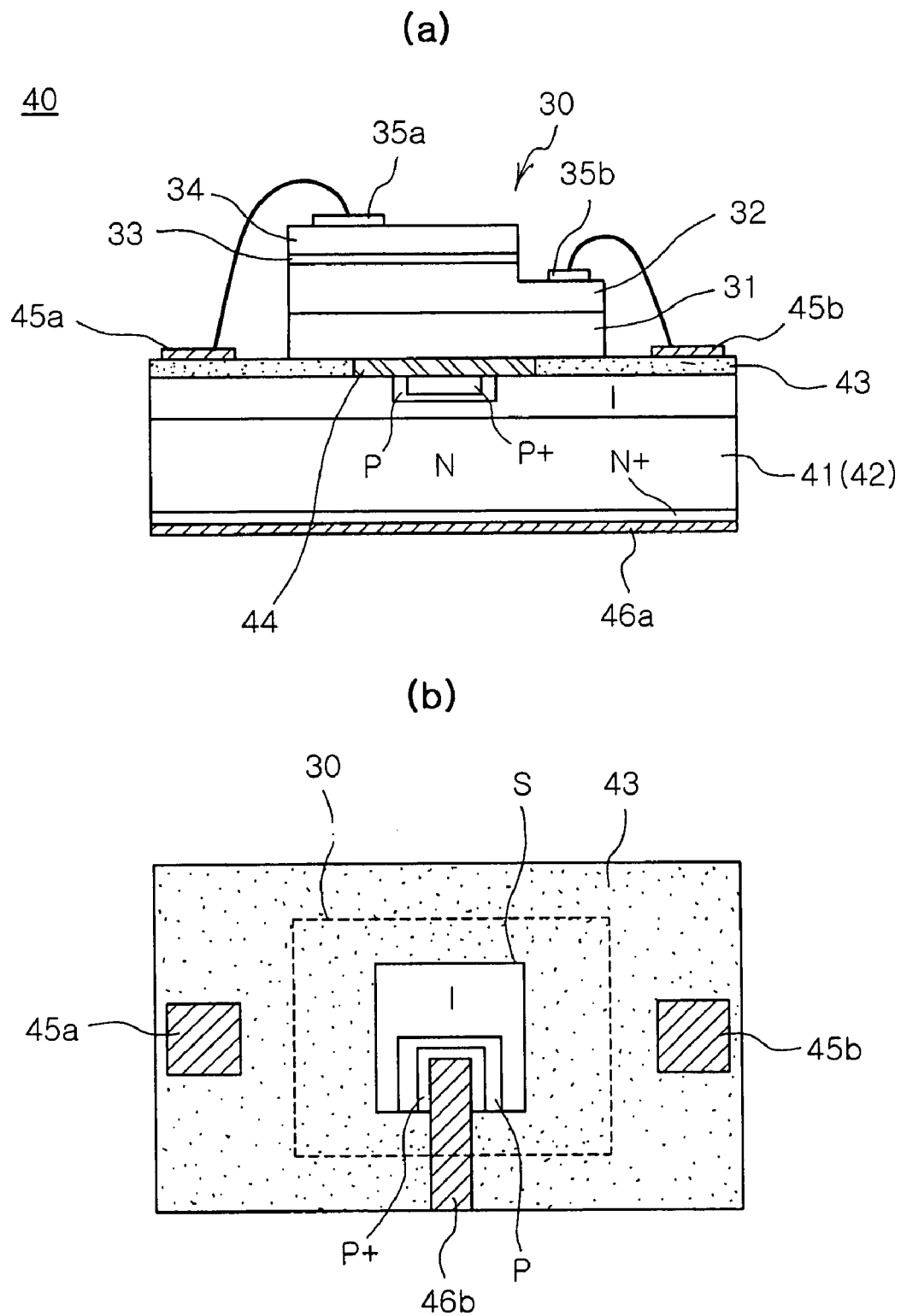

FIG. 3a is a sectional view of the LED package according to the second embodiment of the invention.

The LED package 40 shown in FIG. 3a includes a silicon substrate configured as a photo diode and an LED chip 30 mounted on the silicon substrate 41. The silicon substrate 41 can be provided as the photo diode 42 by forming an intrinsic area and an n-type impurity area in an area of the upper part of the first conductivity-type silicon substrate 41 via a diffusion process.

An LED chip 30 includes a first conductivity-type semiconductor layer 34, an active layer 33 and a second conductivity-type semiconductor layer 34 sequentially formed on a substrate 31. First and second electrodes 35a, 35b have a planar structure facing one direction. Further, an insulation layer 43 is formed on the silicon substrate 41 excluding at least a light-receiving area of the photo diode 42. A partially reflection film 44 may be formed on the light-receiving area of the photo diode 42.

As shown in FIG. 3b, the insulation layer 43 formed on the silicon substrate 41 has an open area S to expose the light-receiving area for photo diode. First and second connecting pads 45a, 45b are formed on opposing faces outside the open area S. The first and second electrodes 35a, 35b of the LED 30 are wire bonded to each of the connecting pads 45a, 45b.

In addition, the photo diode 42 may be activated via an electrode 46a formed in a lower part of the silicon substrate 41 and a connecting terminal 46b formed on the insulation layer 43 to be connected to a specified impurity area.

The embodiments described above are limited to the LED chip having a planar electrode structure but the invention may be advantageously applied to an LED chip having a vertical electrode structure in which first and second electrodes are formed on opposed faces.

Figure 4:
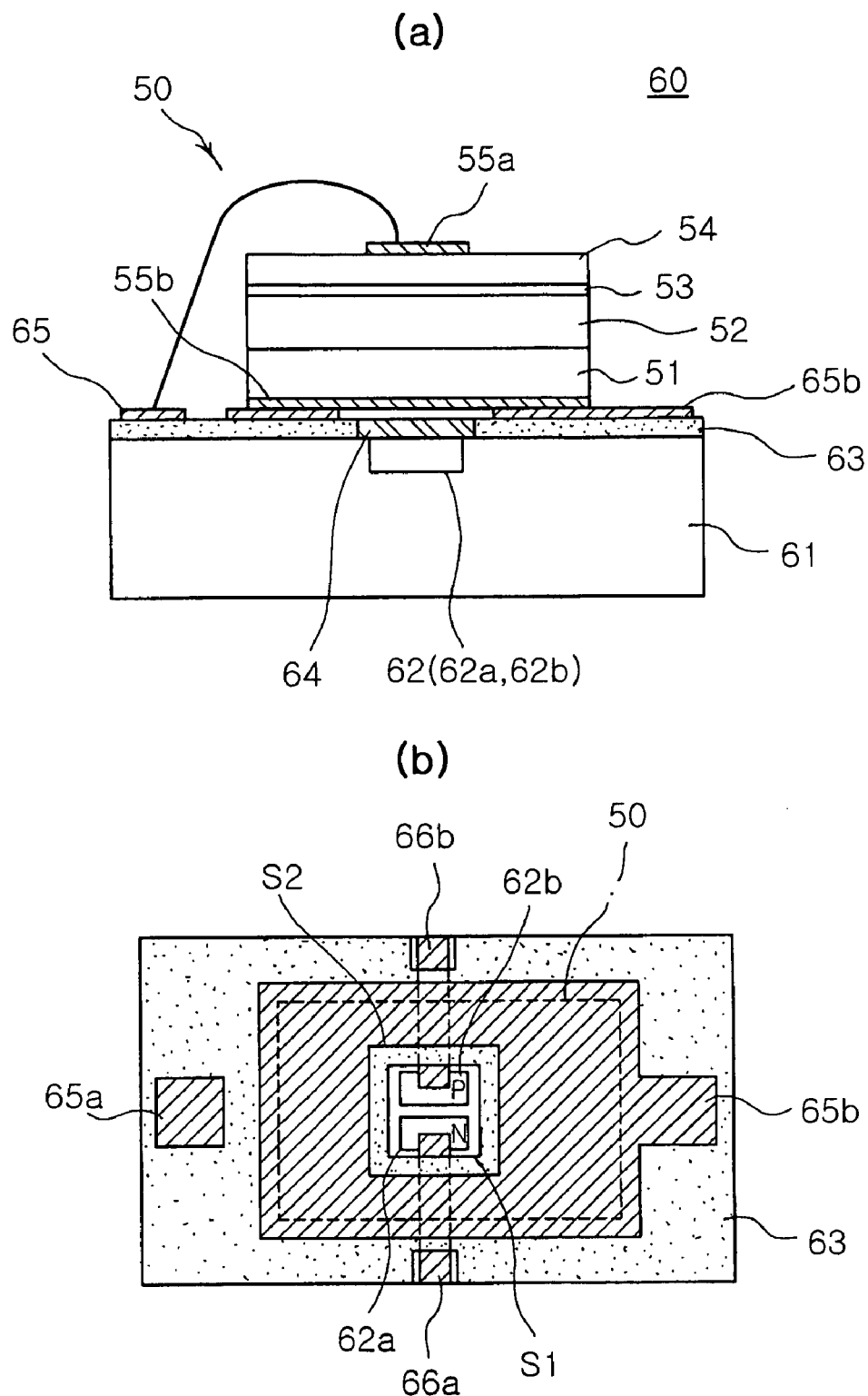

FIG. 4a is a sectional view of the LED package according to the third embodiment of the invention.

An LED package 60 shown in FIG. 4a includes a silicon substrate 61 having a photo diode 62 in an upper part thereof, and an LED chip 50 mounted on the silicon substrate 61. The photo diode 62 may be a PIN structure having p- and n-type impurity areas 62a, 62b formed on an area of an upper part of the silicon substrate 61 via a diffusion process.

An LED chip 50 includes a first conductivity-type semiconductor layer 52, an active layer 53 and a second conductivity-type semiconductor layer 54 sequentially formed on the substrate 51 in a manner similar to the embodiment described above. However, the LED chip 50 employed in the embodiment has a vertical structure in which first and second electrodes 55a, 55b are arranged on opposed faces.

An insulation layer 63 is formed on the silicon substrate 61 excluding at least a light-receiving area S1 of the photo diode 62. A partially reflective film 64 may be formed in the light-receiving area of the photo diode 62. The partially reflective film 64 is formed of a material having low light transmittance so that the photo diode 62 with light generated by the very adjacent LED chip can be transmitted to the photo diode 62 at a proper intensity.

The embodiment of the invention employs a new form of connection pattern that suits a vertical electrode structure. That is, connecting terminals 66a,66b of the photo diode 62 and connecting pads 65a,65b for the LED chip 50 are separated by the insulation layer 63.

More specifically, as shown in FIG. 4b, the connecting terminals 66a,66b connected to each of the impurity areas are formed in the silicon substrate 61 and then the insulation layer is formed thereon. On the insulation layer 63, the first and second connecting pads 65a,65b are formed on both sides of the photo diode 62.

Further, to be connected to a lower electrode of the LED chip 50 having a vertical structure, the second connecting pad 65b is extended to an area where the LED chip 50 is mounted on the insulation layer (marked with a dotted line). In this embodiment, the extended area of the second connecting pad 65b should be preferably large enough to be commensurate with the area where the LED chip is mounted, even though it has an area that exposes the light-receiving area sufficiently S2.

The second electrode formed at the bottom of the LED is connected to the second connecting pad when the LED chip is mounted, and the first electrode of the LED chip may be wire bonded to a second connection means.

According to the invention, a variety of LED packages including photo diode can be provided by replacing a submount substrate for LED packaging with a silicon substrate, and forming a photo diode thereon.

As set forth above, according to the invention, the LEDs with various structures can be packaged by utilizing the silicon submount substrate having a photo diode. This increases optical connection efficiency and fundamentally resolves noise problems that may occur in the case of a separately manufactured package.

While the present invention has been shown and described in connection with the preferred embodiments, it will be apparent to those skilled in the art that modifications and variations can be made without departing from the spirit and scope of the invention as defined by the appended claims.

What is claimed is:

1. A light emitting diode (LED) package comprising:
a silicon substrate;
a photo diode formed in an upper part of the silicon substrate;
an insulation layer formed on the silicon substrate excluding at least a light-receiving area of the photo diode;
a photo diode connecting terminal formed on the insulation layer to be connected to the photo diode;
first and second LED connecting pads formed on the insulation layer, and arranged on both sides of the photo diode;
a partially reflective film comprising an insulating material having a low light transmittance to provide desired light quantity and formed on the photo diode; and
an LED chip mounted on the partially reflective film, and connected to the first and second LED connecting pads,
wherein the partially reflective film is located between the LED chip and the photo diode so that the amount of light that reaches from the LED chip to the photo diode is controlled by the partially reflective film.

2. The LED package according to claim 1, wherein the LED chip has first and second electrodes facing one direction, the first and second electrodes being flip-chip bonded to the first and second connecting pads, respectively.

3. The LED package according to claim 1, wherein the LED chip has first and second electrodes facing one direction, the first and second electrodes being wire bonded to the first and second connecting pads, respectively.

4. The LED package according to claim 1, wherein the second connecting pad is extended to an area where the LED chip is mounted on the insulation layer, and wherein the LED chip has first and second electrodes formed on opposed faces, respectively, the first electrode being wire-bonded to the first connecting pad, and the second electrode being connected to the extended area of the second connecting pad.

5. The LED package according to claim 1, wherein the partially reflective film has a reflectivity of 70% to 90%.

6. The LED package according to claim 5, wherein the insulating material is selected from a group consisting of $SiO_2$, $TiO_2$, $Si_3N_4$, $ZrO_2$ and $HfO_2$.

7. The LED package according to claim 1, wherein the insulation layer is made of the same material as the partially reflective film.

8. The LED package according to claim 1, wherein the photo diode includes first and second conductivity-type impurity areas formed in the upper part of the silicon substrate, and wherein the photo diode connecting terminal comprises first and second terminals, each connected to each of the impurity areas.

9. The LED package according to claim 1, wherein the silicon substrate is a first conductivity-type substrate having an electrode formed in a lower part thereof, the photo diode being formed by doping second conductivity-type impurity in an area of the upper part of the first conductivity-type silicon substrate, and wherein the photodiode connecting terminal is formed on the insulation layer to be connected to the second conductivity-type impurity area.

10. The LED package according to claim 1, wherein the photodiode is formed via an impurity diffusion process or a specified conductivity-type epitaxial layer growth process.

* * * * *